United States Patent [19]
Grabbe et al.

[11] Patent Number: 5,295,841
[45] Date of Patent: Mar. 22, 1994

[54] SUPPORTABLE CONTACT AND CHIP CARRIER SOCKET FOR USE WITH AN ASSEMBLY/DISASSEMBLY TOOL

[75] Inventors: Dimitry Grabbe, Middletown; Iosif Korsunsky, Harrisburg; Michael F. Laub, Etters, all of Pa.

[73] Assignee: The Whitaker Corporation, Wilmington, Del.

[21] Appl. No.: 969,597

[22] Filed: Oct. 30, 1992

[51] Int. Cl.⁵ .............................. H01R 9/09
[52] U.S. Cl. .................... 439/73; 439/72; 439/83; 439/331; 439/526
[58] Field of Search ........................ 439/70–73, 439/82, 83, 330, 331, 525, 526

[56] References Cited

U.S. PATENT DOCUMENTS

| | | | |
|---|---|---|---|
| 4,679,319 | 7/1987 | Grabbe et al. | 29/843 |
| 4,827,607 | 5/1989 | Korsunsky et al. | 29/741 |
| 4,872,845 | 10/1989 | Korsunsky et al. | 439/70 |
| 4,873,761 | 10/1989 | Korsunsky et al. | 29/741 |
| 5,007,845 | 4/1991 | Grabbe | 439/73 |
| 5,062,802 | 11/1991 | Grabbe | 439/72 |
| 5,192,215 | 3/1993 | Grabbe et al. | 439/73 |

OTHER PUBLICATIONS

AMP Product Info. Bulletin (One Sheet)-7201-92-03. Issued May 1992 Published by Inventors' Employer within one year of filing date.

Primary Examiner—Paula A. Bradley
Attorney, Agent, or Firm—Driscoll A. Nina, Jr.

[57] ABSTRACT

An improved contact for use in a high density chip carrier socket mounted on a circuit member which utilizes a cover which to wedge the leads of the chip carrier into electrical engagement with a respective contact. A tool receiving recess is incorporated into the contact so that the forces exerted on the socket while pressing the cover into place can be opposed, minimizing the forces exerted on the connection between the socket and the circuit member, typically a solder joint. Providing a tool, that operates from one side of the circuit member, in order to press the cover into place while engaging the contact recess to oppose the insertion related forces, which can also pull the cover from the contacts, without exerting significant forces on the connection, by engaging a lip in the cover while pressing on the carrier.

10 Claims, 7 Drawing Sheets

SUPPORTABLE CONTACT AND CHIP CARRIER SOCKET FOR USE WITH AN ASSEMBLY/DISASSEMBLY TOOL

This invention relates to the assembly, and disassembly, of flexible lead, high-density, integrated circuit chip carriers with chip carrier sockets electrically connected to a circuit member, typically a circuit board.

FIELD OF THE INVENTION

U.S. Pat. No. 5,007,845 discloses a chip carrier socket that is typical of the type to which this invention is directed. The chip carrier leads are wedged into their corresponding tuning-fork shaped contacts, contained in the socket, by a cover.

During assembly significant forces, sometimes exceeding 100 pounds, are exerted normal to the chip carrier socket as the cover is pressed into position atop the carrier socket. One method of opposing these insertion forces is to support the opposite side of the circuit member while a tool exerts the necessary force on the components. An arbor press is a typical tool for performing this function.

There are numerous problems with this approach. Most obvious being that access to the other side of the circuit member is required. Access is not always obtainable when the chip carrier is installed late in an assembly process or when a chip carrier must be replaced in the field. Furthermore, the side of the circuit opposite the socket must be free of components, both to prevent damage to the components themselves and to assure a surface that is normal to the insertion forces.

Another problem with this assembly method is that insertion forces are exerted on the connection between the circuit member and the contacts resulting in failures. Due to the small size of the contacts and the entire assembly, particularly when the contacts are spaced 0.5 millimeter or less on the substrate, the connection is fragile. In addition to the small size, when addressing surface mount and soldered connections, this fragility is due to the brittle nature of the intermetallic compound which results from the base metal being dissolved in the tin. These failures are difficult to detect and cause significant problems to circuit board assemblers.

What is needed is to provide a way to assemble, and disassemble, a chip carrier socket mounted on a circuit member and a chip carrier while imposing only minimal forces on the connection without accessing the opposite side of the circuit member.

SUMMARY OF THE INVENTION

The present invention relates to the assembly of chip carriers to chip carrier sockets that use a cover to wedge the leads of the chip carrier against the contacts of the socket. The invention comprises an improvement of the socket's contact so that support can be afforded to prevent insertion related forces from being transferred to the connection at the circuit member. The invention further comprises a tool to provide the required support during the assembly process.

It is an object of this invention to effectuate assembly of a chip carrier to a chip carrier socket with only minimal forces being exerted on the connection at the circuit member. It is another object of this invention to enable assembly with access to only the side of the circuit member that the socket is mounted. It is another object of this invention to be able to disassemble the chip carrier from the socket with only minimal forces being exerted on the connection.

It is a feature of this invention that a tool receiving recess is provided in the contacts so that when the engaging members of a tool are inserted, the insertion forces are opposed independent of the connection. It is another feature of the invention that the same tool that opposes the insertion forces performs the cover insertion. It is another feature of this invention that the cover and the tool can be easily modified to perform disassembly operations with minimal force being transmitted to the connection.

It is an advantage of this invention that it requires minimal space around the chip carrier socket to function. It is another advantage of this invention that the tool is portable and can be transported by field service personnel.

DETAILED DESCRIPTION OF THE INVENTION

The figures show a chip carrier 2, a chip carrier socket 4, and a cover 6. Multiple conductive leads 8 extend from the chip carrier 2 and are wedged into their respective contacts 10 within the socket 4 when the cover 6 is installed.

Figure 1:
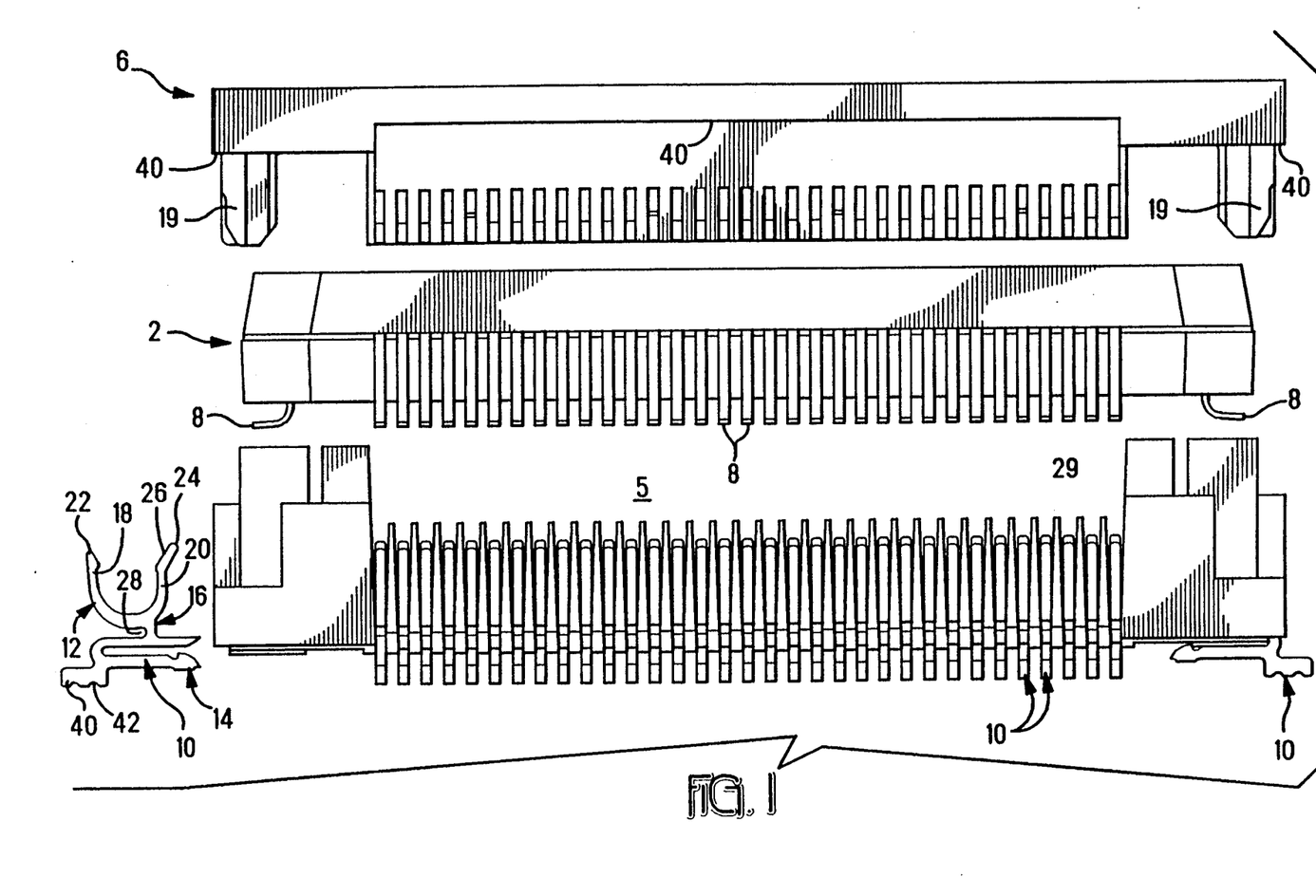
FIG. 1 is a side view of the components prior to assembly.
Figure 2:
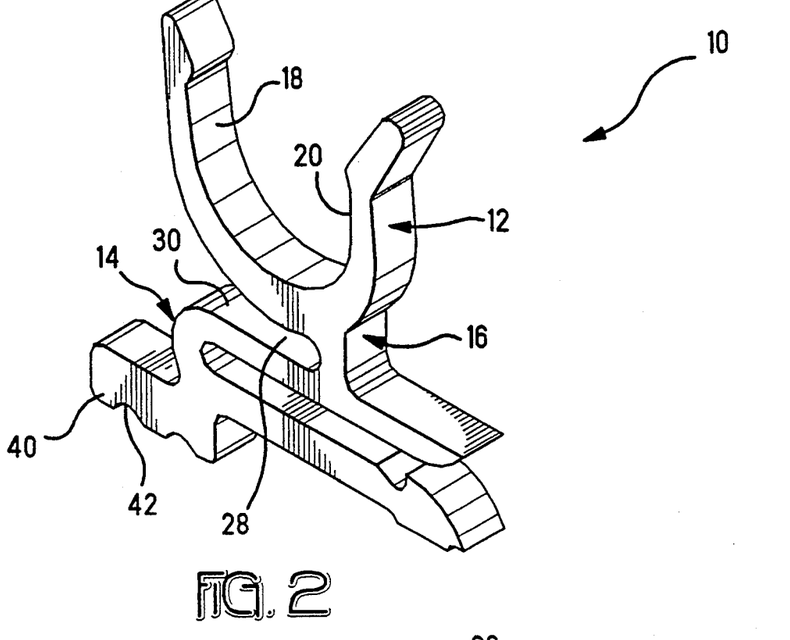
FIG. 2 is an isometric view of the contact.
Figure 3:
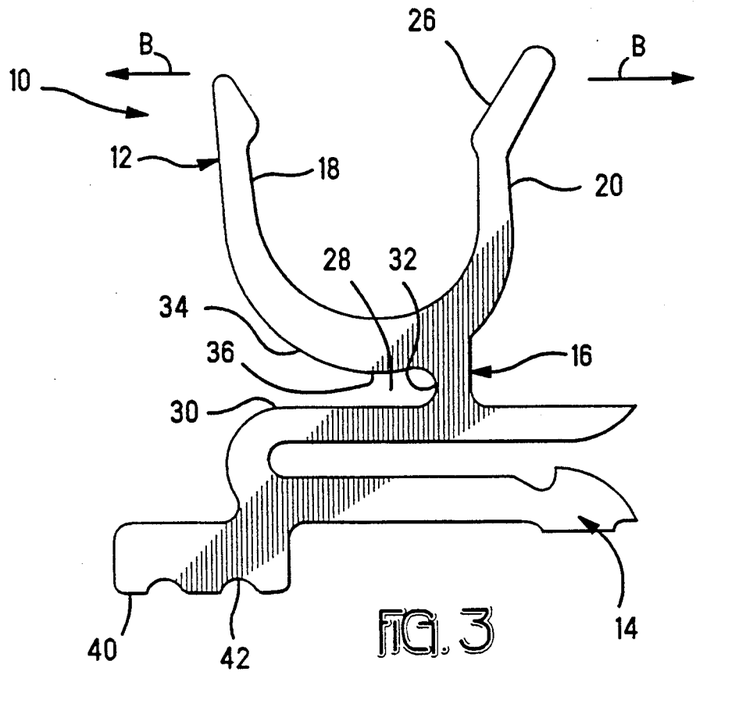
FIG. 3 is a side view of the contact.
Figure 4:
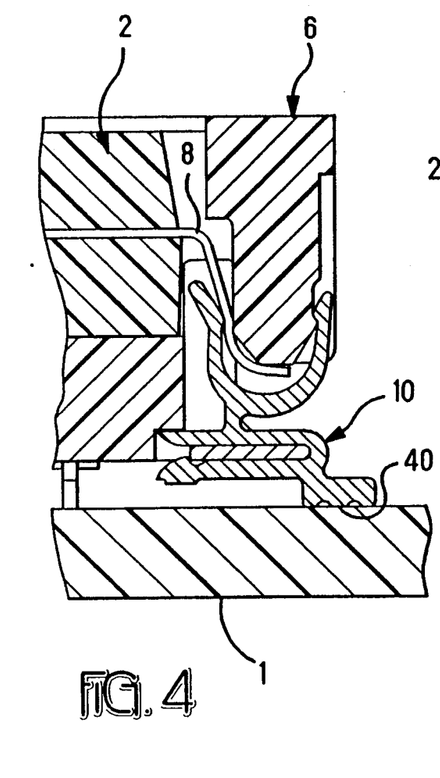
FIG. 4 is a partial sectional view of the assembled components showing a preferred foot.
Figure 5:
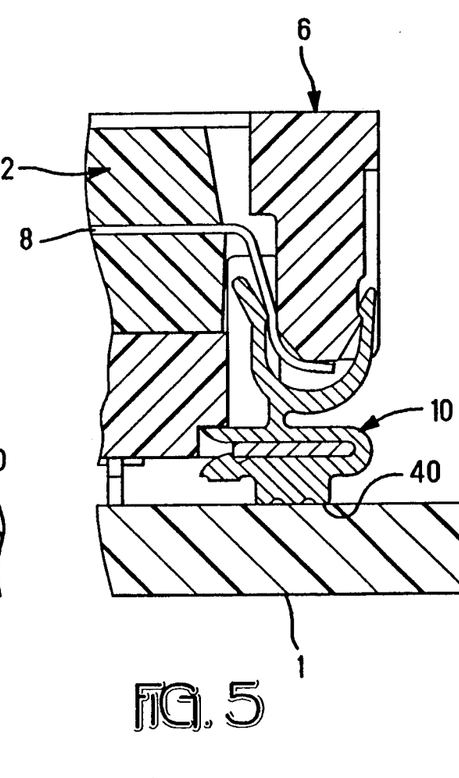
FIG. 5 is a partial sectional view of the assembled components showing an alternative foot.
Figure 6:
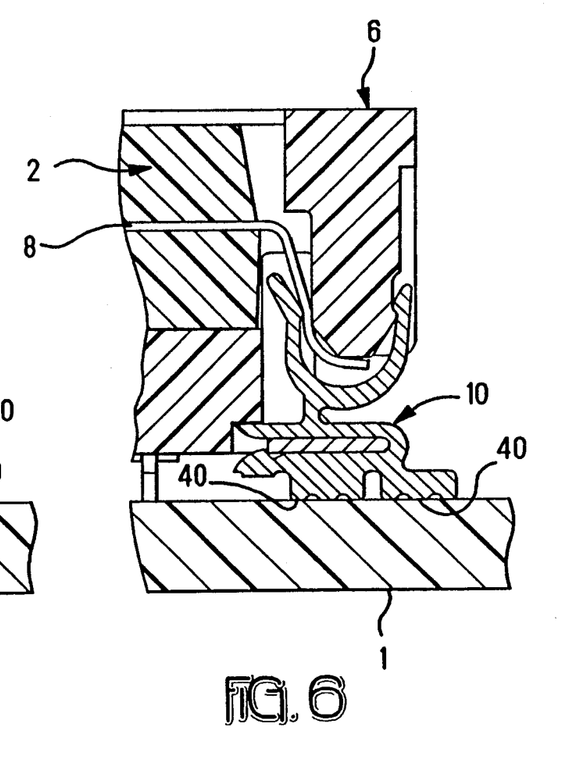
FIG. 6 is a partial sectional view of the assembled components showing another alternative foot.
Figure 7:
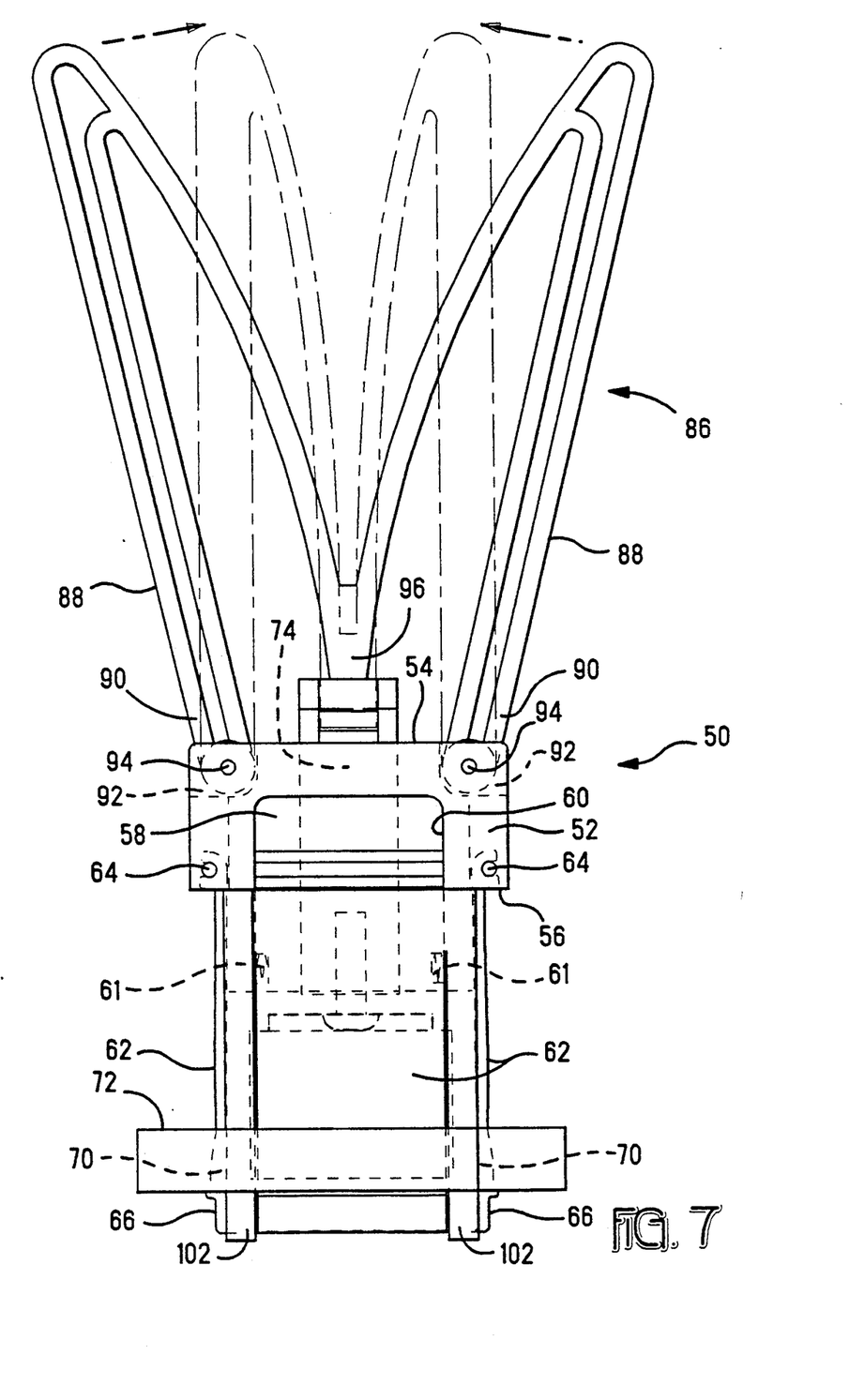
FIG. 7 is a side view of the tool showing the handles in an activated and an inactivated state.

Each contact 10 is of unitary construction comprising a resilient portion 12 and a terminal portion 14 connected by a web 16 as seen in FIGS. 1-3. The terminal portion 14 of the contact has a foot 40 where, in the surface mount embodiment shown, it is soldered to the substrate 1. The foot 40 may have scallops 42 to improve the solder bond with the substrate 1 and the foot 40 may be located directly below the chip carrier leads 8 (shown in FIG. 5), outside the leads 8 (best shown in FIG. 4) or in both locations (shown in FIG. 6). Desirably, the foot 40 would be outward from the chip carrier leads 8 for improved inspection of the solder joint. However, the other configurations allow use of the improved chip carrier socket with circuit members designed and manufactured for direct mounting of the chip carriers.

The embodiment of the resilient portion 14 shown in the figures includes two resilient arms 18,20 having free ends 22,24 spaced from each other. The first resilient arm 20 is the contact arm, and has a contact surface 26 which cooperates with a respective lead 8 of the chip carrier 2 when the cover 6 is in place. The second resilient arm 18 is the back-up arm. The back-up arm 18 cooperates with the cover wedge 19 to keep the lead 8 wedged into electrical engagement with the contact surface 26 when the cover 6 is in place.

The web 16 is a relatively narrow section connecting the resilient portion 12 to the terminal portion 14. The web 16 permits a small amount of pivotal movement by the resilient portion 12 in the directions shown by arrows B in FIG. 3 to accommodate slight misalignments between the mating members during assembly.

These contacts 10 are contained in the chip carrier socket 4 and located around its perimeter, as shown in FIG. 1. Looking outward from the center of the chip carrier socket cavity toward the contacts 10, the contacts 10 are orientated with the contact arm 20 closest to the center of the socket cavity and the backup arm 18 further outward. Each contact further comprises a tool receiving recess 28 that is open in the outward facing direction. The recess 28 is formed by an upwardly facing surface 30 of the terminal portion 14, an outwardly facing surface 32 of the web 16 and a downwardly facing surface 34 of the resilient portion 14.

The centerline of the resilient portion 14 is defined as the line on which the resultant torques due to the forces related to insertion of the chip carrier 2 are balanced. The contact 10 is constructed so that the web 16 is located inward of the point of intersection between the centerline of the resilient portion 14 and the downwardly facing surface 34. Optimally, it is at this point of intersection where the force opposing the insertion force should be directed by providing support normal to the centerline.

Due to variations in the components of the chip carrier socket assembly, it is advantageous to have the downwardly facing surface 34 have a curved portion in the area where the point of intersection is expected to exist. This will allow a surface that is complimentary to the downwardly facing surface 34 to oppose the insertion related forces essentially along the centerline even if the exact orientation of the centerline varies slightly from the predicted location.

In the particular embodiment shown in the figures, the resilient portion 14 and the web 16 are oriented to form a tuning fork shaped contact 10. The outwardly facing surface 32 of the web 16 is disposed towards the contact arm 20, beyond the intersection of the centerline and the downwardly facing surface 34. This provides a portion of the downwardly facing surface 34 that may be engaged by a tool essentially normal to the forces required to insert the cover 6.

The chip carrier socket 4 is adapted so that the tool receiving recess 28 is accessible from the perimeter of the socket 4 through externally exposed side faces 29. This is accomplished by providing a slot corresponding to the recess 28 or forming the socket 4 in a manner that leaves the outward side of the contacts exposed, as shown in FIG. 1.

In practice, one way of electrically connecting the chip carrier socket 4 to the circuit member 1 is by soldering each contact foot 40 to its respective pad on the circuit member 1 by known soldering techniques. The chip carrier 2 is then placed in the chip carrier socket cavity 5 and oriented so that the leads 8 of the chip carrier 2 correspond to their respective contacts 10. The cover 6 is then placed over the leads 8 and the contacts 10.

Once the chip carrier contacts 10, the leads 8 of the chip carrier 2 and the cover 6 are orientated, the cover 8 is ready to be pressed into place. A tool 50, as best shown in FIGS. 7-10, is used to support the resilient portion 14 by engaging the tool receiving recess 28 and exerting a force on the downwardly facing surface 34 in the direction opposite the insertion related forces imposed on the contact. In a preferred embodiment, the same tool 50 that performs the support function will also perform the function of pressing the cover 6 into place.

The tool 50 has a frame 52 with a cross-section that generally corresponds to the shape of the chip carrier socket 4, an upper end 54 and a lower end 56, as viewed in the drawings, and a central opening 58 extending between the ends. Slots 60 are provided in the sides of the frame 52 corresponding to the rows of contacts 10 in the chip carrier socket 4. The slots 60 extend upward from the lower end 56. An engagement member 62 is provided in each of the slots 60 and is connected to the frame 52 by a pivot pin 64. The engagement member 62 is disposed outward from the slots 60 by spring 61 mounted on the frame 50.

The free end 66 of each engagement member 62 has an inwardly directed lip 68 contoured to be received in the tool receiving recess 28 and engage the downwardly facing surface 34. In the particular embodiment shown, the inwardly directed lip 68 is contoured complimentarily to the downwardly facing surface 34 so that it extends along the downwardly facing surface 34 to at least the point of intersection with the centerline on which the insertion related forces act. The outer surface of each engagement member has a cam portion 70 which cooperates with the internal surfaces of a slidable locking member 72 to move the inwardly directed lip 68 into the tool receiving recess 28.

The locking member 72 has an opening corresponding to the shape of the chip socket 4 and is dimensioned to enable the locking member 72 to be slidable on the engagement members 62 between a disengaged position (shown in FIG. 8), when the ring is in its upper position near the pivot pin 64, and a first engaged position (shown in FIG. 9), when the locking member 72 is in its lower position. This first engaged position is established by the cam portion 70 which, when in contact with the locking member, disposes the inwardly directed lip 68 into the tool receiving recess 28 an amount sufficient to support the point of intersection but not enough to exert a significant force on the web 16.

Contained within the central opening 58 of the frame 52 is a plunger 74 having an upper end 76 and a lower end 78 corresponding to the upper end 54 and lower end 56 of the frame 52. The plunger 74 is movable relative to the frame 52. Connected to the lower end of the plunger 74 is an insertion press 80. The insertion press 76 can be made from plastic or any other material that will not damage the chip carrier 2 or the cover 8 while still being strong enough to transfer the required insertion forces. Preferably, the insertion press 76 is removably attached to the plunger 74 by a fastener 82. It may also be attached by providing the plunger 74 and the insertion press 80 with mating threads or any of the numerous methods known in the art.

At the end opposite the plunger 74, the insertion press 80 has a pressing surface 84 adapted to engage only on the top of the cover 6. Typically, the insertion press 80 will have a pocket 86 that extends from the pressing surface 84 towards the plunger an amount greater than the amount which the chip carrier 2, or any appendages attached thereto--such as a heatsink 85, extend above the top of the cover 6, whereby the insertion press 80 does not come into contact with the chip carrier 2 during the insertion procedure.

The distance between the upper end 76 of the plunger 74 and the pressing surface 84 is selected so that when the plunger 74 is at its maximum downward stroke, the pressing surface 84 is above the inwardly directed lip 68 an amount essentially equal to the distance between the top of the installed cover 6 and the downwardly facing surface 34 of the contact 10. This is to assure that during the insertion process the tool 50 does not act to damage the solder connection or deform the contacts 10 by continuing to exert a force on the contacts 10 after the cover 6 has been installed.

Attached to the upper end 76 of the plunger 74 and the upper end 54 of the frame 52 is a means for actuating the plunger 74 moving it through its stroke. The actuator 86 shown in the figures comprises a handle assembly disclosed in U.S. Pat. No. 4,387,610 which is hereby incorporated by reference in its entirety. Although this is a hand operated actuator, it is envisioned that various automatic actuator systems (electric, hydraulic or pneumatic) may be used to fulfill the function of moving the plunger 74 through its stroke.

The handle assembly 86 has handles 88 with ends 90 that are pivotally connected within opposed cutouts 92 in the frame 52 by pins 94 that extend through the frame 52 and the ends of the handles 88. The other ends 96 of the handles 88 are attached to the plunger 74 by way of a compliant monolithic molded structure. Whereby, as the handles 88 are compressed towards each other and released, the plunger 74 is moved through its stroke.

The frame 52 can be further modified to have alignment legs 102 that extend from the lower end 56 of the frame 52 to reference the circuit member 1 on which the chip carrier socket 4 is located; thereby, orienting the tool 50 essentially perpendicular to the chip carrier socket during the assembly operation. These legs 102 will extend downward from the frame 52 placing the inwardly directed lip 68 essentially adjacent the tool receiving recess 28 of the contacts 10 when the legs are resting on the circuit member 1 and the tool 50 is in an unactuated condition. The legs 102 are positioned in such a way that they do not interfere with the chip carrier socket 28 or adjacent components on the circuit member 1.

In use, a chip carrier socket 4 having contacts 10 is soldered to a circuit member 1 so that the contacts 10 are electrically connected to their respective pads. A chip carrier 2 is oriented with its leads 8 corresponding to their mating contacts 10. The chip carrier cover 6 is then positioned over the leads 8 so that the leads 8 will be wedged into electrical engagement with the contact surface 26 of the contact arm 20 when the cover 6 is pressed into place.

Figure 8:
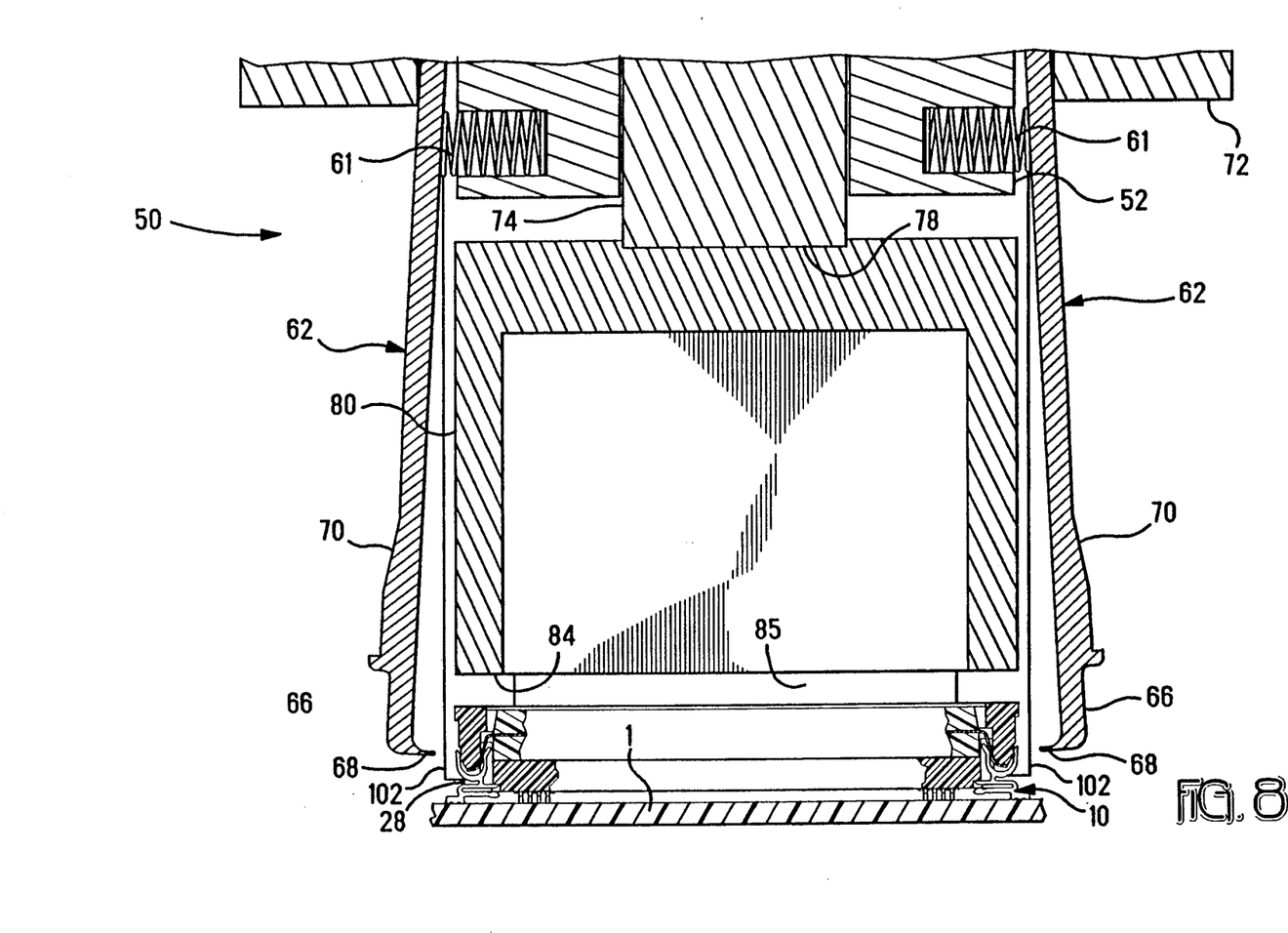
FIG. 8 is a partial cut away view of the assembled chip carrier socket and the tool in the disengaged position.
Figure 9:
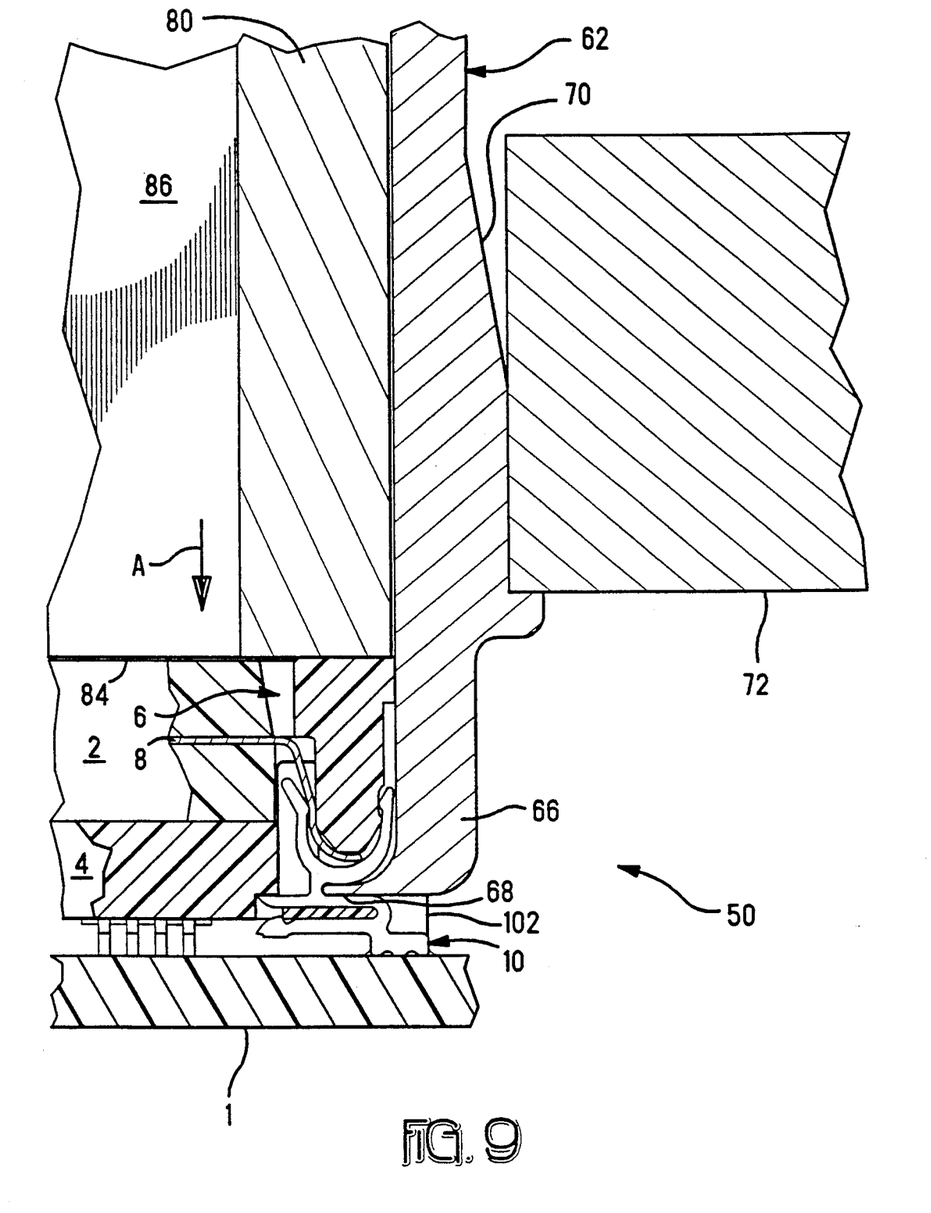
FIG. 9 is a partial cut away view of the assembled chip carrier socket and the tool in the first engaged position.

The tool 50 is positioned over the loosely oriented chip carrier components so that the legs 102 are flat on the circuit member 1 and the engagement members 62, in a disengaged position, generally surround the contacts 10 opposite the tool receiving recesses 28, as shown in FIG. 8. The locking member 72 is lowered onto the cam portion 70 of the engagement members 62 thereby urging the inwardly directed lip 68 into engagement with the tool receiving recess 28, as shown in FIG. 9.

Once the tool 50 is engaged with the tool receiving recess 28 on all four sides of the socket, the handles 88 are pressed together causing the pressing surface 84 of the insertion press 80 to come into contact with the chip carrier cover 6. Continued actuation of the handles 88 causes the cover 6 to be pressed in the downward direction.

The inwardly directed lip 68 is in a supporting relationship with the downwardly facing surface 34 of the tool receiving recess 28. While the engagement members 62 remain stationary, the plunger 74 and cover 6 move downward. As the cover 6 is pressed down, the wedges 19 on the cover 6 are pushed between the contact arm 20 and the back-up arm 18, wedging the leads 8 into electrical engagement with their respective contacts 10. The supporting relationship of the lip 68 with the recess 28 opposes the force used to press the wedges 19 into place preventing insertion related forces from being transferred to the soldered connection.

When actuation is complete, the plunger 74 has moved through its full travel and the cover 6 and chip carrier 2 have been assembled with the chip carrier socket 4. When the handles 88 are released, the insertion press 80 is drawn back from the cover 6. The locking member 72 is lifted from the cam portion 70 of the engagement members 62 and the inwardly directed lip 68 disengages the tool receiving recess 28 allowing removal of the tool 50.

Figure 10:
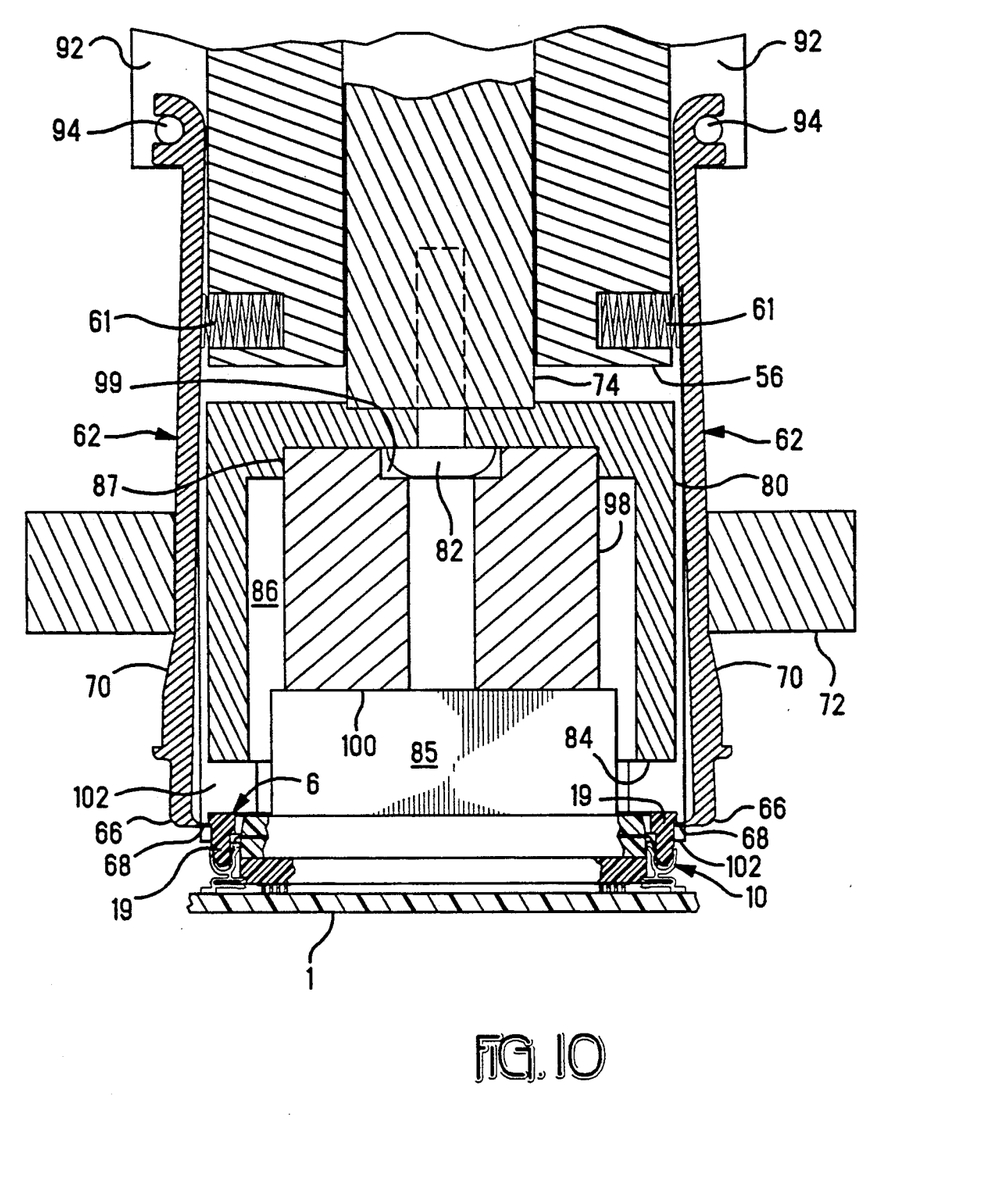
FIG. 10 is a partial cut away view of the assembled chip carrier socket and the tool in the second engaged position.

Another feature of the invention is that it can be adapted to perform disassembly of the chip carrier 2 from the chip carrier socket 4 by removing the cover 6 from wedged engagement with the leads 8 and the contacts 10. This configuration is shown in FIG. 10. The cover 8 has an engagement lip 40 formed around its perimeter. This engagement lip 40 is formed by a protrusion extending beyond the outer edge of the wedge 19 or by undercutting the cover 6 in the area that corresponds to the rows of contacts 10, as shown in FIG. 1.

The purpose of the engagement lip 40 is to provide an element for the inwardly directed lip 68 of the engagement members 62 to engage. Therefore, the inwardly directed lip 68 must be further adapted to be able to engage the protruding lip 40 of the cover 6, in addition to the tool receiving recess 28.

In order to provide a uniform force to remove the cover 6, the insertion press 80 is further modified with a counterbore 87 at the top of the pocket 86 of sufficient size to accept the head of the fastener 82. A removal press 98 having a pressing surface 100, constructed to engage only the top of the chip carrier 2, is seated within the pocket 86. The pressing surface 100 extends from the pocket 86 a distance sufficient to allow the wedges 19 to be pulled from the contacts 10 by the engagement members 62. As shown in FIG. 10, the counterbore 87 is of a size that enables the removal press 98 to be seated within. So that the removal press 98 seats square to the insertion press 80, a second counterbore 99 is incorporated into the removal press 98 where it fits against the insertion press 80. The counterbore 99 is configured to accommodate the head of fastener 82. In an alternative form, the insertion press 80 is removed from the end of the plunger 74 and a removal press 98 is installed in its place.

To remove a chip carrier 2 from a socket 4, the engagement members 62 engage the protruding lip 40 by sliding the locking member 72 against the cam portion 70. Once in this second engaged position, shown in FIG. 10, the plunger 74 is actuated and the removal press 98 presses down against the chip carrier 2, holding it stationary relative the socket. The pressing surface 100 must contact the chip carrier 2 while there is sufficient stroke of the plunger 74 remaining to lift the wedges 19 from the resilient portion 14 of the contacts 10. Continued activation of the handles 86 results in the pulling of the cover 6 from the chip carrier socket 4, thereby freeing the chip carrier 2 from the socket 4, in a manner similar to a conventional gear puller.

It will be appreciated that the present invention has significant advantages for the assembly, and disassembly, of chip carriers with chip carrier sockets that wedge the leads of the carrier into the contacts of the socket. Accordingly, it should be recognized that the above-described embodiments constitute the presently preferred forms of the invention and that the invention could take numerous other forms. Accordingly, the invention should be only limited as required by the scope of the following claims.

We claim:

1. An electrical contact for electrically connecting a chip carrier lead to a respective conductive area on a circuit member where said lead is wedged into electrical contact with the contact by the insertion of a wedge, said contact adapted so that the insertion forces required to wedge said leads against said contact can be opposed so as not to act on the connection with the circuit member, comprising:
   a resilient portion for engaging the lead, said resilient portion having a contact surface in wedged electrical engagement with the lead;
   a terminal portion in electrical engagement with the respective conductive area on the circuit member;
   a web extending between and electrically interconnecting the resilient portion and the terminal portion for enabling flexure therebetween, said web being offset to one side of the contact to provide a tool receiving recess between the resilient portion and the terminal portion, said recess adapted to enable canceling the insertion related forces by providing support to said recess.

2. The contact according to claim 1, wherein the terminal portion of the contact has scallops where connected with the circuit member.

3. The contact according to claim 1, wherein the terminal portion of the contact has a foot for contact with the circuit member, said foot located under the leads.

4. The contact according to claim 1, wherein the terminal portion of the contact has a foot for contact with the circuit member, said foot being located outward from the leads.

5. The contact according to claim 1, wherein the terminal portion of the contact has a foot where in contact with the circuit member, said foot being located directly below the leads and outward from the leads.

6. The contact according to claim 1, wherein the resilient portion has a contact arm and a back-up arm adapted to cooperate with the wedge to urge the lead against said contact arm, said resilient portion being further adapted so that the insertion forces exerted on the arms, when the wedge is being pressed into place, are balanced about the centerline of said resilient portion.

7. An improved chip carrier socket for electrically connecting leads on a chip carrier to respective conductive areas of a circuit member wherein the leads are spaced apart and project from a peripheral edge of the chip carrier and are held in contact with their respective contacts within the chip carrier socket by a cover which is pressed into place, said chip carrier socket being adapted for so that the insertion related forces required to wedge said leads against said contact can be opposed so as not to act on the connection with the circuit member; said socket comprising:
   a housing having
      a chip carrier socket cavity;
      a plurality of contacts located around the perimeter of the cavity, said contacts having
         a resilient portion made of a contact arm and a back-up arm adapted to cooperate with the cover to urge the lead against said contact arm, said resilient portion being further adapted so that the insertion forces exerted on the arms, when the cover is being pressed into place, are balanced about the centerline of said resilient portion;
         a terminal portion adapted for electrical connection to the circuit member;
         a web connecting said resilient portion and said terminal portion;
         a tool receiving recess facing outward from the chip carrier socket cavity, said recess defined by an upwardly facing surface of the terminal portion, an outwardly facing surface of the web and a downwardly facing surface of the resilient portion, wherein said outwardly facing surface of the web is disposed inward along the downwardly facing surface beyond the point of intersection of the downwardly facing surface and a centerline of the resilient portion;
      an externally exposed side face in communication with the contacts; and
      a cover including a wedge for wedging each of the leads into pressing engagement with the resilient portion of the contact;
   whereby, during assembly, support is provided to the tool receiving recess so that when the cover is being pressed into place and the chip carrier leads are being wedged into pressing engagement with the resilient portion of the contact, the insertion forces normal to the chip carrier socket are opposed by a tool.

8. The socket according to claim 7, wherein the downwardly facing surface of the contact has a portion that is essentially normal the direction of the insertion forces exerted on the contact, said portion containing the point of intersection between the centerline of the resilient portion and the downwardly facing surface.

9. The socket according to claim 7, wherein the cover has an engagement lip adapted for pulling the cover from the contacts.

10. A method of assembling highdensity, flexible lead, integrated circuit chip carriers to surface mount chip carrier sockets having tuning fork shaped contacts, wherein each lead is electrically connected to a respective contact which in turn is electrically connected to a circuit member, whereby minimal assembly forces are exerted on the circuit member connection, the steps comprising:
   placing the chip carrier into the chip carrier socket cavity of the socket;
   orientating the leads of the chip carrier so that each lead is adjacent a respective contact;

pressing a cover into engagement with the leads and into the tuning fork shaped contact, thereby wedging the lead and the cover within between a contact arm and a backup arm of a resilient portion of the contact; while simultaneously, opposing the pressing forces by engaging a tool receiving recess in the contacts located beneath the resilient portion of the contact.

* * * * *